(12) United States Patent
Stern et al.

(10) Patent No.: US 9,622,355 B2
(45) Date of Patent: Apr. 11, 2017

(54) ENVIRONMENTALLY SEALED ELECTRICAL HOUSING ASSEMBLY WITH INTEGRATED CONNECTOR

(71) Applicant: DELPHI TECHNOLOGIES, INC., Troy, MI (US)

(72) Inventors: Eric J. Stern, Farmington Hills, MI (US); William J. Mosby, Redford, MI (US)

(73) Assignee: Delphi Technologies, Inc., Troy, MI (US)

( * ) Notice: Subject to any disclaimer, the term of this patent is extended or adjusted under 35 U.S.C. 154(b) by 500 days.

(21) Appl. No.: 13/936,266

(22) Filed: Jul. 8, 2013

(65) Prior Publication Data
US 2015/0009640 A1    Jan. 8, 2015

(51) Int. Cl.
| | |
|---|---|
| H05K 3/30 | (2006.01) |
| H01R 13/66 | (2006.01) |
| H01R 43/18 | (2006.01) |
| H01R 13/52 | (2006.01) |
| H01R 13/70 | (2006.01) |
| H01R 43/20 | (2006.01) |

(52) U.S. Cl.
CPC ........... *H05K 3/30* (2013.01); *H01R 13/6658* (2013.01); *H01R 43/18* (2013.01); *H01R 13/5213* (2013.01); *H01R 13/70* (2013.01); *H01R 43/205* (2013.01); *H01R 2201/26* (2013.01); *Y10T 29/4913* (2015.01)

(58) Field of Classification Search
CPC .. H05K 5/0034; H01R 2201/26; H01R 13/70; H01R 12/716; H01R 12/724; H01R 13/5213
See application file for complete search history.

(56) References Cited

U.S. PATENT DOCUMENTS

| | | | |
|---|---|---|---|
| 4,940,419 A | 7/1990 | Kurita et al. | |
| 5,057,041 A * | 10/1991 | Yu | H01R 13/7195 29/842 |
| 5,263,620 A * | 11/1993 | Hernandez | B23K 1/018 225/1 |

(Continued)

OTHER PUBLICATIONS

European Search Report dated Nov. 7, 2014.

*Primary Examiner* — Xanthia C Cunningham
(74) *Attorney, Agent, or Firm* — Robert J. Myers (57) ABSTRACT

An environmentally sealed electrical housing assembly with an integrated connector and a method for manufacturing same is presented. The assembly includes a non-accessible electrical component, such an electromechanical relay, and a plurality of terminals connected to a circuit board. A dielectric housing encases the non-accessible electrical component. The housing is in intimate contact with the non-accessible electrical component, thereby sealing it from the environment. The housing defines an integral perimeter wall that surrounds the terminals, forming a connector shroud. Removable electrical components, such as fuse assemblies, may be attached to the terminals inside the shroud. When a sealed mating connector is attached to the housing, the removable components are also sealed from the environment. The assembly allows distribution of power switching functions and circuit protection to be distributed to a location near the electrical load instead of a central location, such as a bussed electrical center.

1 Claim, 7 Drawing Sheets

(56) References Cited

U.S. PATENT DOCUMENTS

| | | | |
|---|---|---|---|
| 5,311,398 A * | 5/1994 | Schirmer | B60R 16/0239 174/548 |
| 5,420,758 A | 5/1995 | Liang | |
| 5,774,342 A * | 6/1998 | Brandenburg | H01L 23/49861 174/538 |
| 5,777,850 A * | 7/1998 | Jakob | B60R 16/0239 361/736 |
| 5,823,798 A * | 10/1998 | Zintler | B60R 16/0238 439/76.2 |
| 5,971,796 A * | 10/1999 | Duhr | H01R 13/516 439/364 |
| 6,180,045 B1 * | 1/2001 | Brandenburg | H05K 3/0061 264/263 |
| 6,307,749 B1 * | 10/2001 | Daanen | H05K 3/284 174/50.5 |
| 6,360,438 B1 | 3/2002 | Gladd et al. | |
| 6,445,592 B1 | 9/2002 | Schirmer | |
| 6,779,260 B1 * | 8/2004 | Brandenburg | H01L 23/3121 174/541 |
| 7,134,194 B2 * | 11/2006 | Brandenburg | H05K 1/147 257/686 |
| 7,151,674 B2 * | 12/2006 | Sasaki | B60R 16/0239 174/521 |
| 7,455,552 B1 | 11/2008 | Fang et al. | |
| 7,616,448 B2 * | 11/2009 | Degenkolb | H05K 3/284 174/50.5 |
| 7,914,297 B2 * | 3/2011 | Ikeda | H01R 9/2466 439/76.1 |
| 8,172,618 B1 * | 5/2012 | Wang | H01R 12/724 439/620.08 |
| 9,185,831 B2 * | 11/2015 | Moon | H05K 5/0034 |
| 2001/0012708 A1 * | 8/2001 | Mizuno | H05K 1/142 439/76.1 |
| 2003/0156393 A1 * | 8/2003 | Lin | G01R 31/318516 361/760 |
| 2003/0161092 A1 * | 8/2003 | Cho | G01R 11/04 361/659 |
| 2004/0223304 A1 * | 11/2004 | Kobayashi | B60R 16/0238 361/715 |
| 2005/0231896 A1 * | 10/2005 | Yamashita | B60R 16/0238 361/600 |
| 2006/0272150 A1 | 12/2006 | Eguchi et al. | |
| 2008/0259586 A1 | 10/2008 | Hosokawa et al. | |
| 2009/0184577 A1 * | 7/2009 | Parnis | H01R 13/68 307/9.1 |
| 2009/0298310 A1 * | 12/2009 | Nakanishi | H02G 3/088 439/76.2 |
| 2010/0032183 A1 | 2/2010 | Brandenburg et al. | |
| 2010/0263915 A1 * | 10/2010 | Shiraiwa | H05K 1/0201 174/252 |
| 2012/0268864 A1 * | 10/2012 | Borowicz | H05K 5/0239 361/601 |
| 2013/0286606 A1 * | 10/2013 | Watanabe | H05K 7/1417 361/752 |

* cited by examiner

ENVIRONMENTALLY SEALED ELECTRICAL HOUSING ASSEMBLY WITH INTEGRATED CONNECTOR

TECHNICAL FIELD OF THE INVENTION

The invention generally relates to an electrical housing assembly, and more particularly relates to an environmentally sealed electrical housing assembly with an integrated connector.

BACKGROUND OF THE INVENTION

Electromechanical relays that provide electrical load switching in a motor vehicle are typically protected from the environment within enclosures known as bussed electrical centers that are located at central points in the vehicle such as the engine compartment, instrument panel, or luggage compartment (rear trunk). Electrical power is supplied from the vehicle electrical system to the bussed electrical centers. Control signals are transmitted from controllers in the vehicle to the electromechanical relays within the bussed electrical centers to turn power to the loads on and off. Power is supplied to the electromechanical relay switch contacts and the switched electrical power is connected to remote loads through a wiring harness and connection system.

When the number of remote electrical loads exceeds the number of relays available in the bussed electrical center, additional feature content often requires the use of auxiliary power distribution boxes containing relays and/or fuses. Such auxiliary boxes may be difficult to package within the vehicle due to environmental concerns. Typically, auxiliary power distribution boxes are not watertight and are limited to being packaged "right side up", that is the cover on top and connector on the bottom, in an area of the vehicle designated as a low splash zone.

The subject matter discussed in the background section should not be assumed to be prior art merely as a result of its mention in the background section. Similarly, a problem mentioned in the background section or associated with the subject matter of the background section should not be assumed to have been previously recognized in the prior art. The subject matter in the background section merely represents different approaches, which in and of themselves may also be inventions.

BRIEF SUMMARY OF THE INVENTION

In accordance with one embodiment of this invention, a method of manufacturing an environmentally sealed electrical housing assembly with an integrated connector is provided. The method includes the steps of providing a generally planar circuit board, mechanically and electrically attaching at a non-accessible electrical component to the circuit board at an exterior location, mechanically and electrically attaching a terminal to the circuit board generally normal thereto at an interior location separate from the non-accessible electrical component, integrally molding a dielectric material over the non-accessible electrical component so as to concurrently form a base and an integral perimeter wall surrounding the terminal, thereby forming an open sided container and sealing the non-accessible electrical component from the environment while leaving the terminal accessible, and electrically connecting a removable electrical component to the terminal. The method may further include the step of removably attaching a sealed cover to the integral perimeter wall, thereby completing a sealed container around the terminal and the removable electrical component. The non-accessible electrical component may be an electrical switching device such as an electromechanical relay and the removable electrical component may include a fusible link.

In accordance with another embodiment of this invention, an environmentally sealed electrical housing assembly with an integrated connector produced according to the method described above is provided.

In accordance with yet another embodiment of this invention, an environmentally sealed electrical housing assembly with an integrated connector is provided. The assembly includes a generally planar circuit board and a non-accessible electrical component that is mechanically and electrically connected to the circuit board. The assembly also includes a plurality of terminals that are mechanically and electrically connected to the circuit board with an orientation generally normal to the major surfaces of the circuit board and at an interior location separate from the non-accessible electrical component. The assembly further includes a housing that is formed of a dielectric material. The housing encases the non-accessible electrical component and a portion of the circuit board containing the non-accessible electrical component. The housing is in intimate contact with the non-accessible electrical component and the portion of the circuit board containing the non-accessible electrical component. The non-accessible electrical component is sealed from the environment while leaving the plurality of terminals accessible. The housing also defines an integral perimeter wall surrounding the plurality of terminals. The connector assembly may further include a removable electrical component that is mechanically and electrically connected to at least a pair of terminals in the plurality of terminals. The integral perimeter wall may form a shroud configured to receive a sealed cover. Insertion of the sealed cover into the shroud completes a sealed container around the plurality of terminals and the removable electrical component. The non-accessible electrical component may be an electrical switching device such as an electromechanical relay and the removable electrical component may include a fusible link.

Further features and advantages of the invention will appear more clearly on a reading of the following detailed description of the preferred embodiment of the invention, which is given by way of non-limiting example only and with reference to the accompanying drawings.

BRIEF DESCRIPTION OF THE SEVERAL VIEWS OF THE DRAWING

The present invention will now be described, by way of example with reference to the accompanying drawings, in which.

DETAILED DESCRIPTION OF THE INVENTION

Described herein is an environmentally sealed electrical housing assembly with an integrated connector, referred to hereafter as a housing assembly. The housing assembly includes a housing that encases selected non-accessible electrical components thereby sealing them from the environment. The housing also includes an opening that allows access to other removable electrical components and with a mating connector body, forms a sealed compartment that protects the removable components from the environment. The housing assembly allows distribution of power switching functions and circuit protection to be distributed to a location near the electrical load instead of form a central location in a vehicle. The housing provides protection of the electrical components from the environment allowing placement of these components outside of a protective enclosure, such as a bussed electrical center. The housing assembly may be placed in areas of harsh splash such as near wheel wells. The choice of location is limited only by the integrity of connector seal.

FIGS. 1-5 illustrate a non-limiting example of an environmentally sealed electrical housing assembly with an integrated connector 10. The housing assembly 10 includes a generally planar circuit board 12, commonly known as a printed circuit board (PCB). The circuit board 12 may be made from epoxy or polyimide resins. The resin may be reinforced with a woven glass cloth or other matrix such as chopped fibers. Circuit boards formed of such materials are commonly called FR-4 or G-10 type circuit boards. The circuit board 12 may alternately be constructed of ceramic, rigid or flexible polymers. This listing of acceptable circuit board materials is not exhaustive and other materials may also be used successfully.

Figure 6:
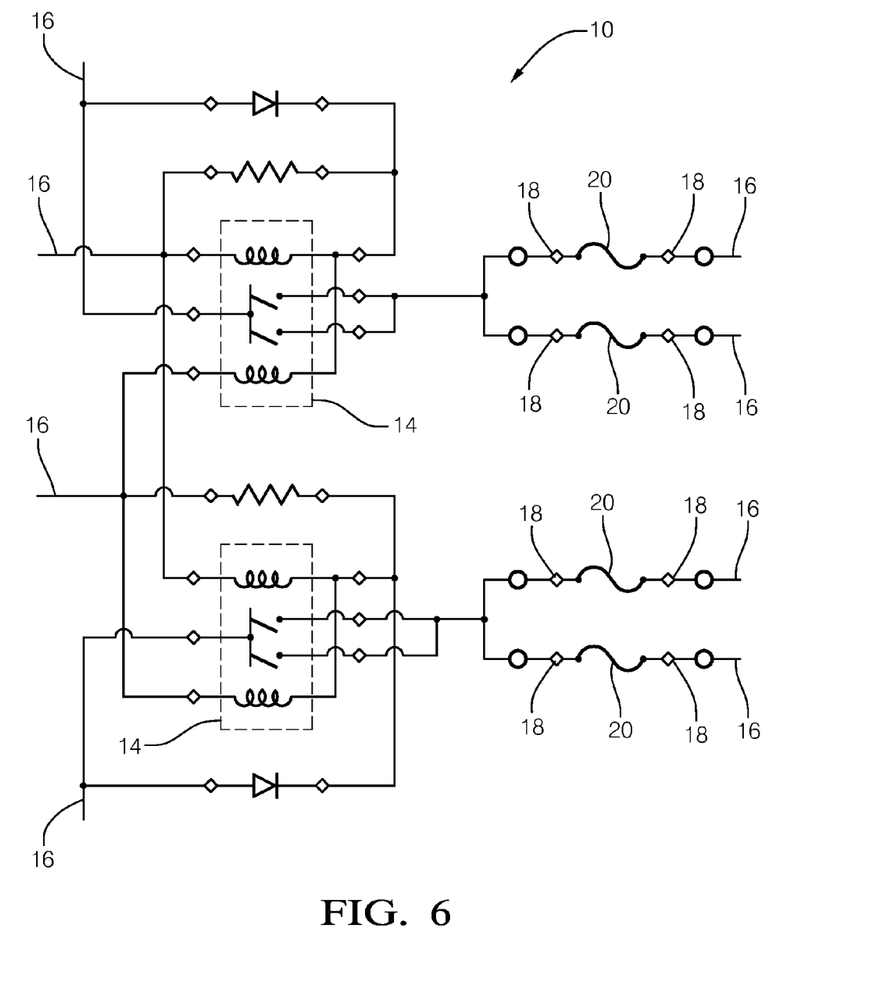
FIG. 6 is a schematic circuit diagram of the environmentally sealed electrical housing assembly with an integrated connector of FIG. 1 in accordance with one embodiment.

The housing assembly 10 contains a non-accessible electrical component 14, such as an electromechanical relay, resistor, and/or diode that is mechanically and electrically connected to the circuit board 12. The non-accessible electrical components 14 are generally non-serviceable and therefore are not necessarily in a location that can be accessed from outside of the housing assembly 10 once the circuit board 12 is contained within the housing 22. A schematic circuit diagram of an example housing assembly 10 having two electromechanical relays is shown in FIG. 6. Automotive grade relays suitable for mounting to printed circuit boards are available from a variety of suppliers including Panasonic Electric Works Corporation of America in Farmington Hills, Mich., Omron Electronic Components in Schaumburg, Ill., Fujitsu Components America in Sunnyvale, Calif., or Daesung Electric Company in Ansan South Korea.

Figure 1:
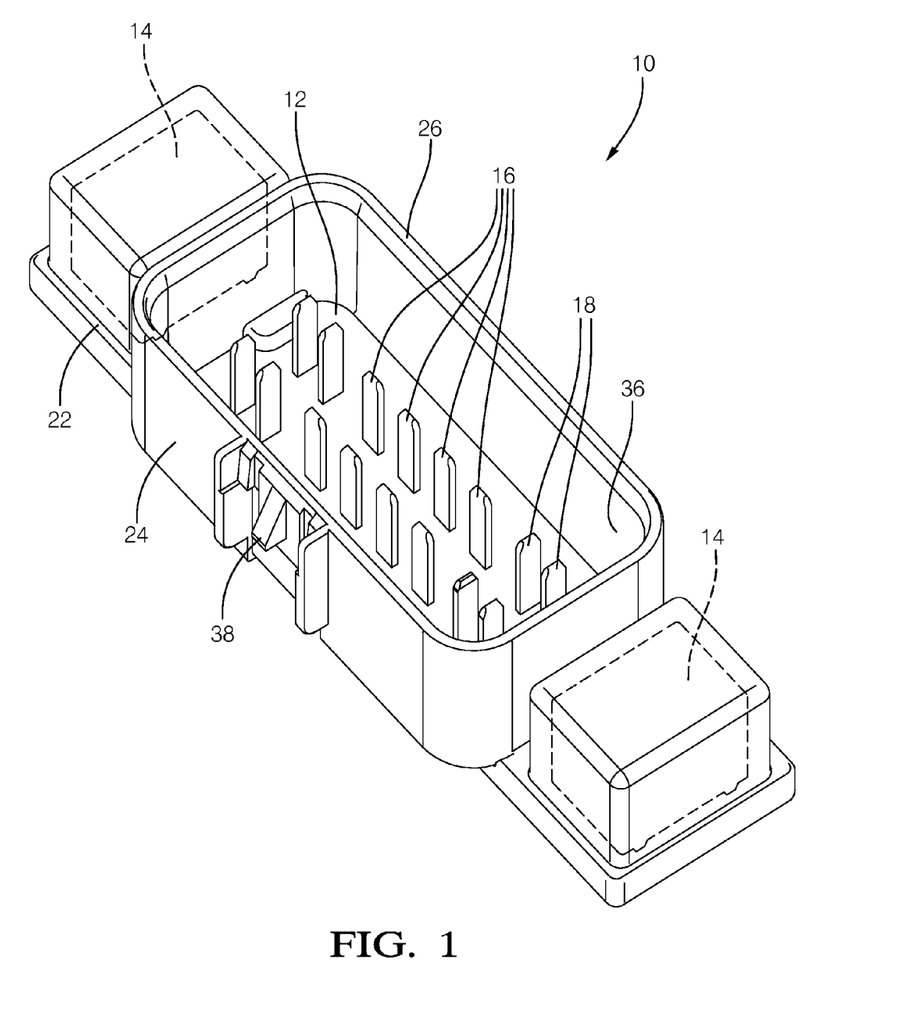
FIG. 1 is a perspective top view of an environmentally sealed electrical housing assembly with an integrated connector in accordance with one embodiment.
Figure 2:
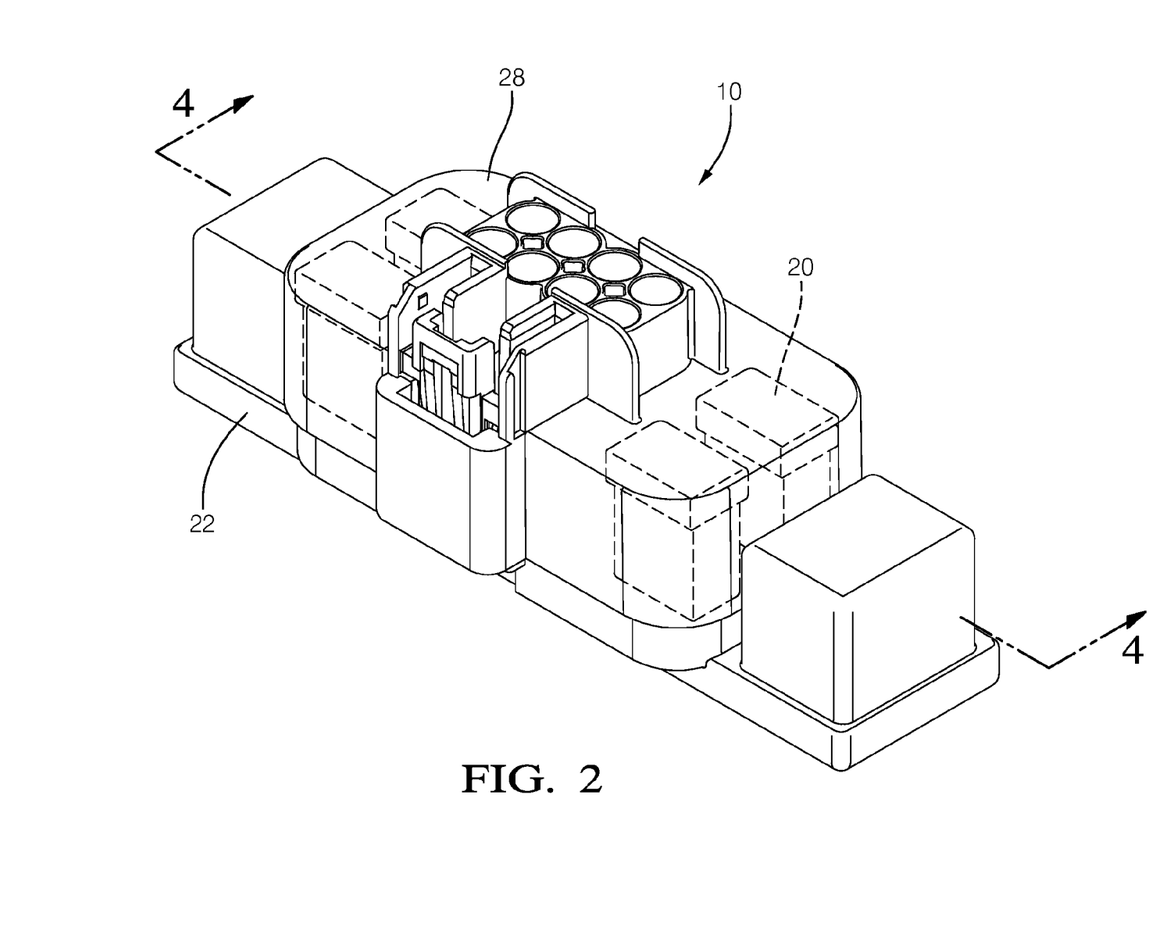
FIG. 2 is a perspective top view of the environmentally sealed electrical housing assembly with an integrated connector of FIG. 1 and a sealed connector body in accordance with one embodiment.

The housing assembly 10 further includes a plurality of electrical terminals 16, 18 that are mechanically and electrically connected to the circuit board 12. The terminals 16, 18 shown in the example of FIG. 1 are male blade terminals having a generally rectangular cross section. The terminals 16, 18 are generally oriented normal to the major surfaces of the circuit board 12. Male terminals having a different cross section, such as square or round or alternatively female terminals may also be successfully used in other embodiments of the housing assembly 10. The terminals 16, 18 are located on the circuit board 12 in a location separate from the non-accessible electrical components 14. A first portion of the terminals 16 is configured to mechanically and electrically join with corresponding mating female terminals 30 that are connected to the vehicle wiring harness in order to attach power lines and control signal lines to the housing assembly 10. A second portion of the terminals 18 are configured to be connected to removable electrical components 20, such as fuse assemblies 20 that contain a fusible link to provide overcurrent protection on the power lines. An example of a fuse assembly having female terminals is the MCASE™ fuse manufactured by Littlefuse, Inc. of Troy, Mich. Each fuse assembly 20 is connected to at least two of the terminals in the second portion of terminals 18. The non-accessible electrical components 14 and the electrical terminals 16, 18 are connected to conductive traces (not shown) on the circuit board 12 by soldering to plated through holes (not shown), surface mount pads (not shown), or other techniques well known to those skilled in the art.

A housing 22 completely encases the non-accessible electrical components 14 and a portion of the circuit board 12 that contains the non-accessible electrical components 14. The housing 22 is in intimate contact with the non-accessible electrical components 14 and the portion of the circuit board 12 containing the non-accessible electrical components 14 and surrounds these components, thereby sealing them against intrusion of environmental contaminants, such as water, salt, oils, and dirt. The housing 22 defines an integral perimeter wall 24 that surrounds the plurality of terminals 16, 18. The perimeter wall 24 defines an opening 26 that allows electrical and physical access to the terminals 16, 18 for connecting the mating female terminals 30 and the fuse assemblies 20 to the terminals 16, 18. The opening 26 also allows access to the fuse assemblies 20 while servicing the housing assembly 10 to replace fuse assemblies 20 that have open circuited due to a transient overcurrent condition. The housing 22 seals the non-accessible electrical components 14 from the environment while leaving the plurality of terminals 16, 18 accessible. The housing 22 is formed of a dielectric material, such as polypropylene or polyamide, typically and hereafter referred to by the trade name of NYLON.

In the illustrated embodiment, the housing 22 encases only the portion of the circuit board 12 containing the non-accessible electrical components 14. Other embodiments of the housing assembly 10 may be envisioned in which the housing 22 completely encases the circuit board 12 and a bottom portion of the terminals 16, 18 attached to the circuit board 12 while leaving a top portion of the terminals 16, 18 exposed and available for connection to the corresponding mating female terminals 30 and removable electrical components 20.

Figure 3:
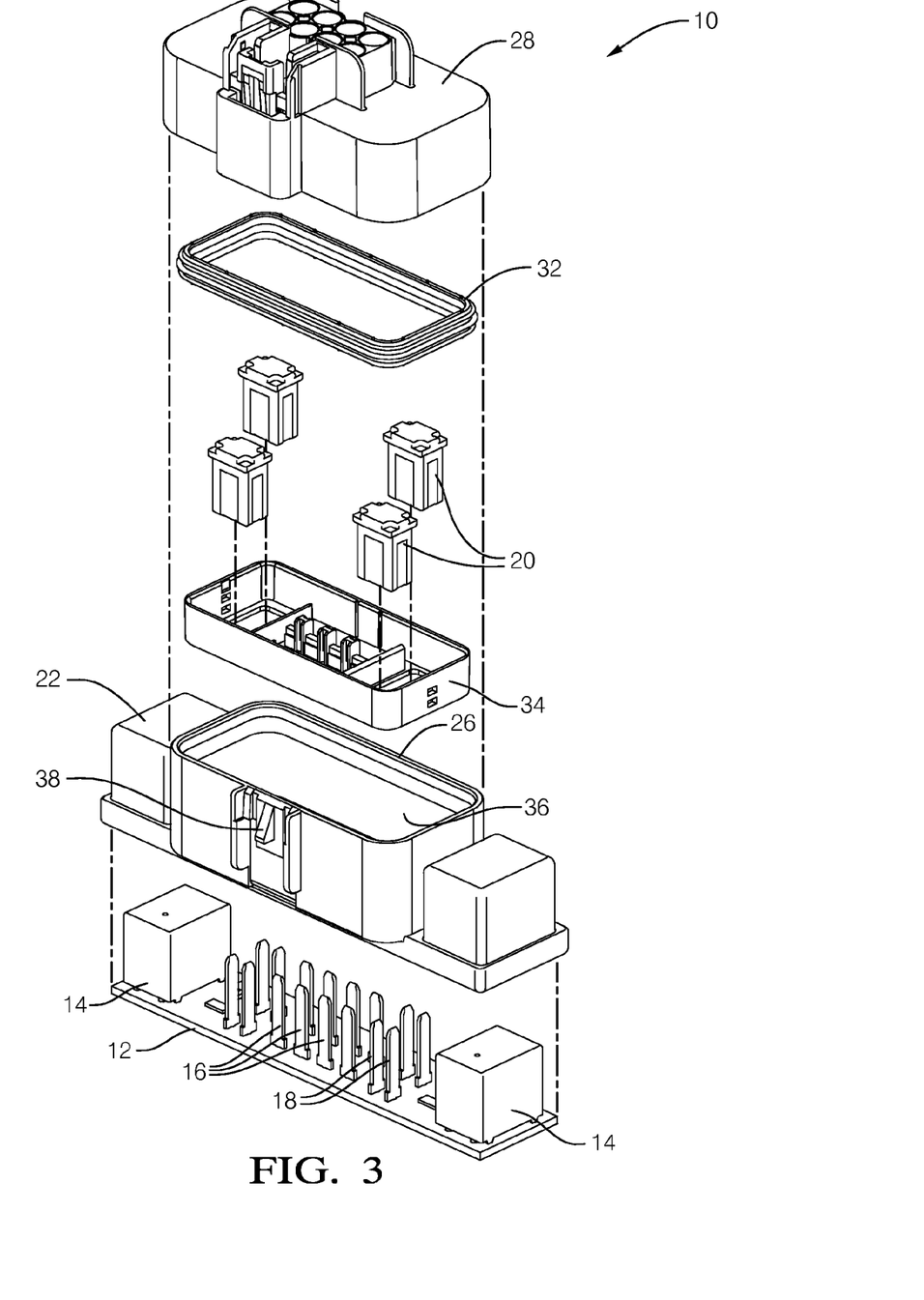
FIG. 3 is an exploded perspective view of the environmentally sealed electrical housing assembly with an integrated connector of FIG. 1 and the sealed connector body of FIG. 2 in accordance with one embodiment.
Figure 4:
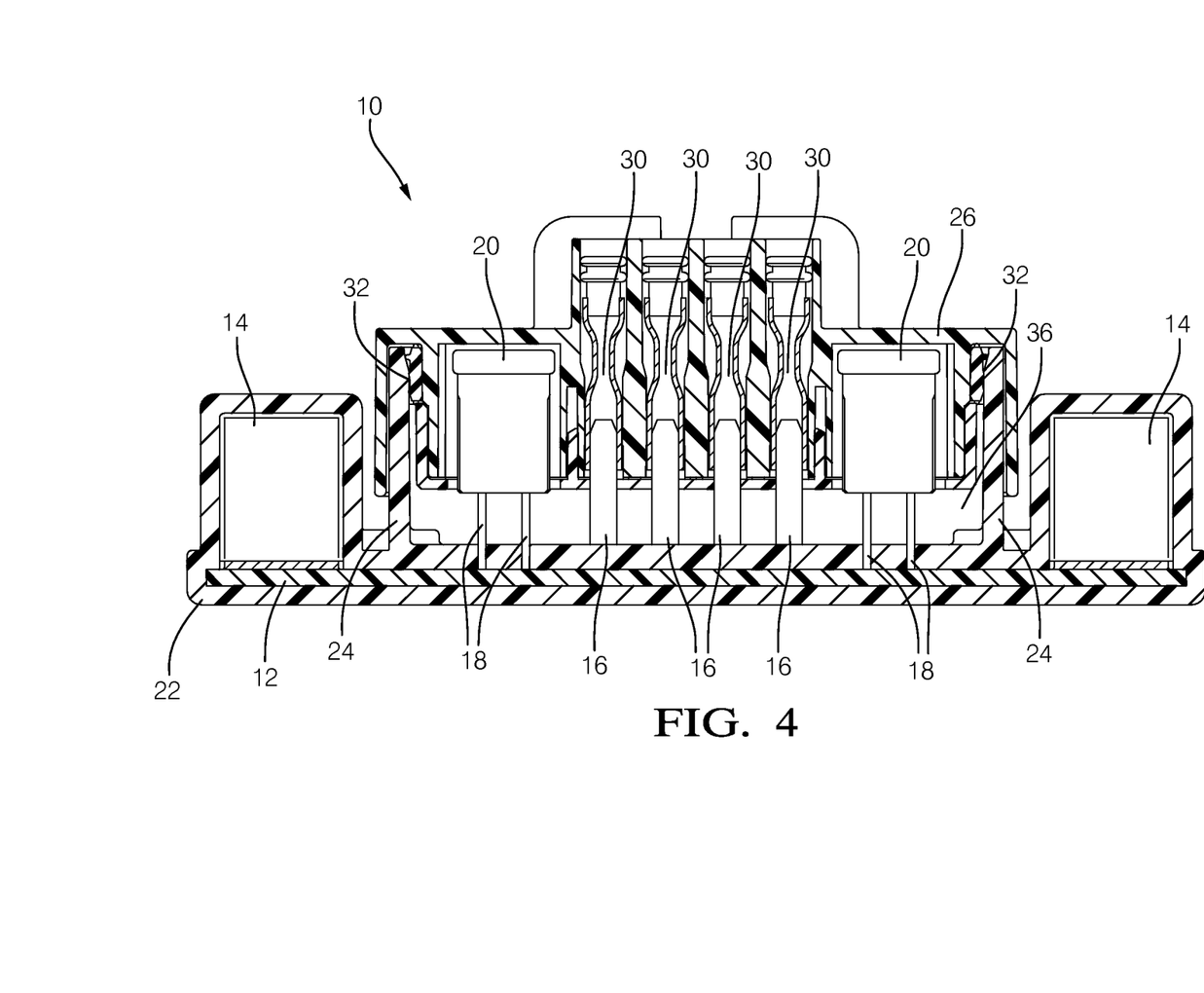
FIG. 4 is a cross sectional side view of the environmentally sealed electrical housing assembly with an integrated connector of FIG. 1 and the sealed connector body of FIG. 2 in accordance with one embodiment.
Figure 5:
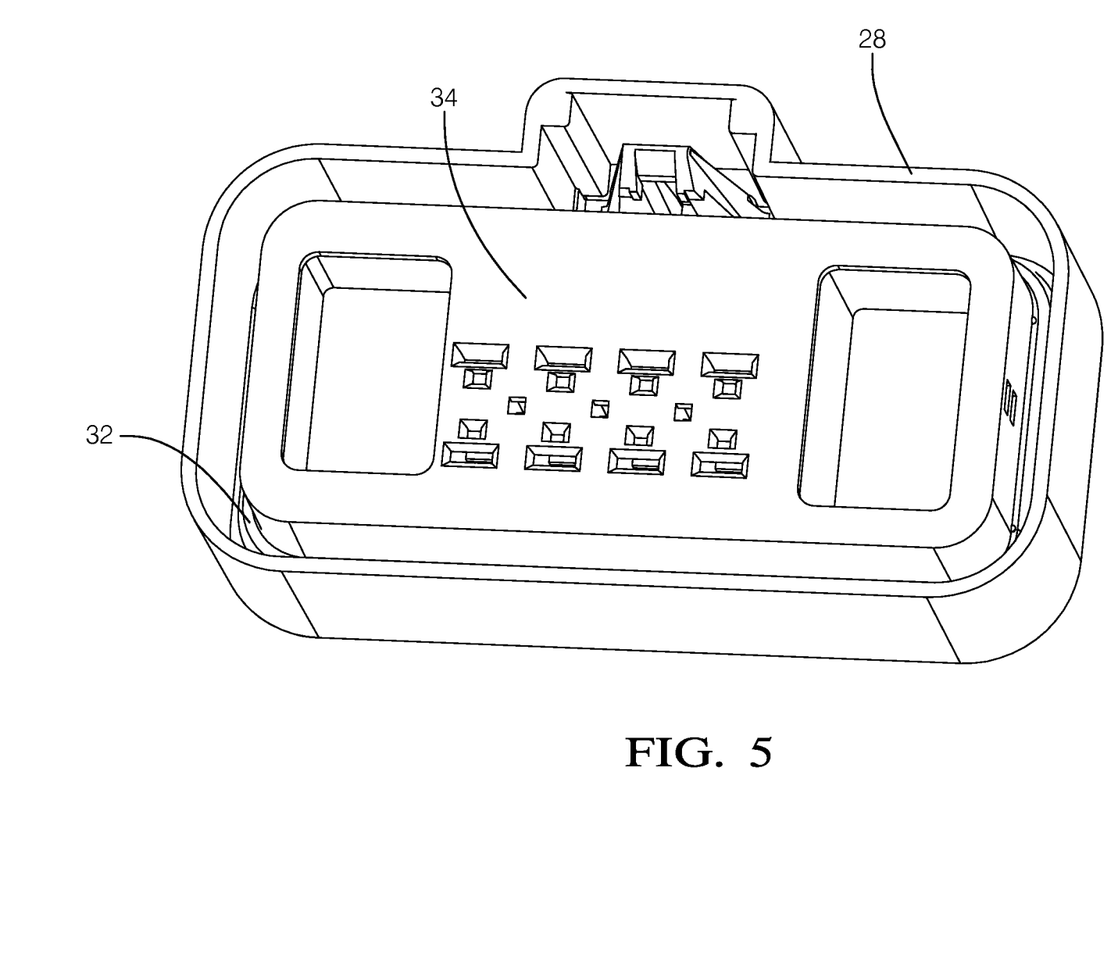
FIG. 5 is a perspective bottom view of the sealed connector body of FIG. 2 in accordance with one embodiment.

The perimeter wall 24 forms a shroud configured to receive a connector body 28 containing the mating female terminals 30, a compliant seal 32 disposed on the perimeter of the connector body 28 and, in this example, a terminal position assurance (TPA) device 34. The connector body 28 forms a sealed cover for the cavity 36 defined by the perimeter wall 24. Insertion of the connector body 28 into the shroud completes a sealed container around the plurality of terminals 16, 18 and the fuse assemblies 20. The connector body 28, mating female terminals 30, and compliant seal 32 may be part of a sealed connection system, such as the GT280 connection system manufactured by Delphi Corporation of Troy, Mich.

The housing 22 provides features 38 for mating to the connector body 28 such as keying features to assure proper connector body orientation and latching/locking features to secure the connector body 28 to the housing assembly 10. The housing 22 may also provide features (not shown) for the attachment of various mounting devices, such as clips to secure the housing assembly 10 to the vehicle structure. Other embodiments of the housing may include mounting features such as tab, clips, treaded studs, threaded inserts, etc. molded into the housing at the same time the circuit board is over-molded.

Figure 7:
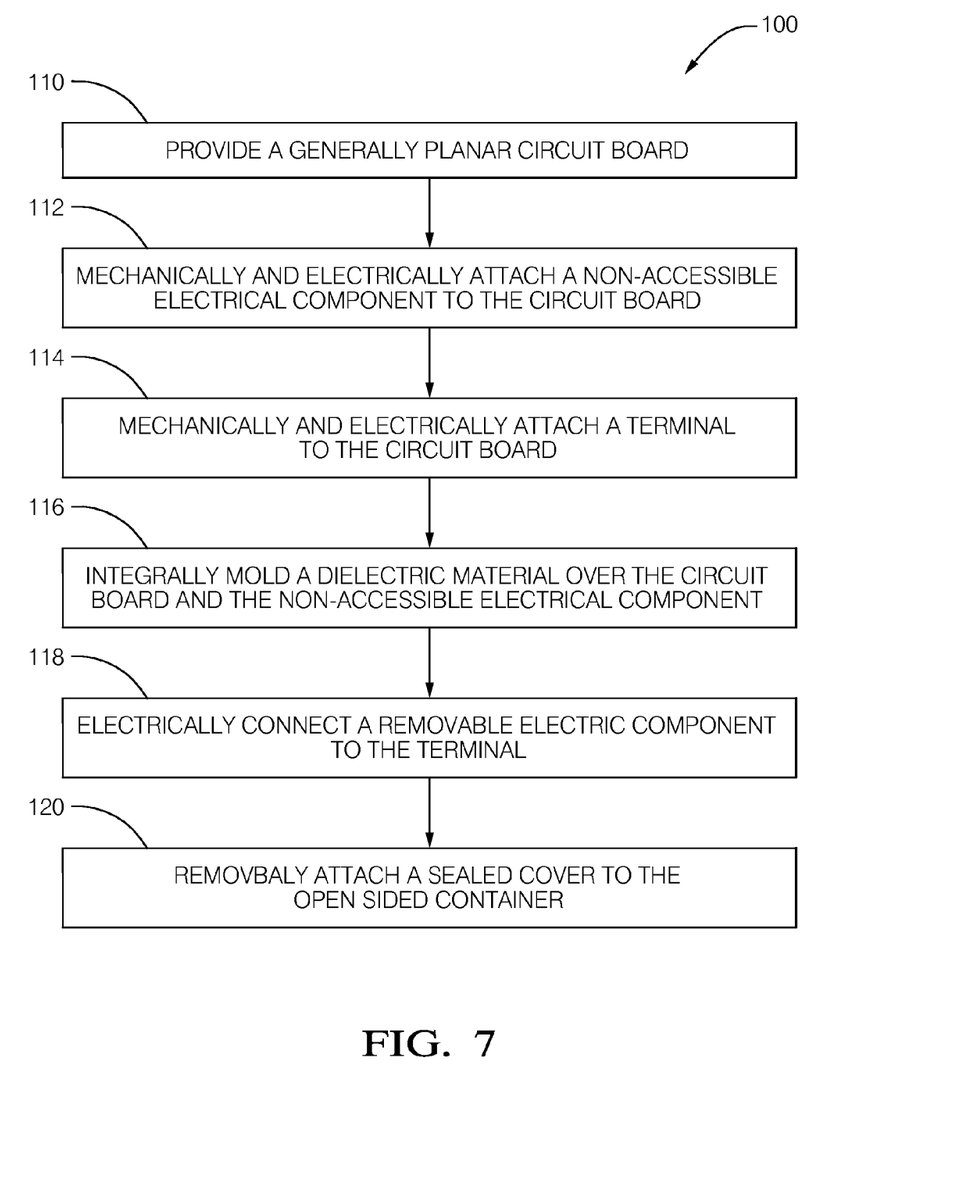
FIG. 7 is a flow chart diagram of a method of manufacturing an environmentally sealed electrical housing assembly with an integrated connector in accordance with one embodiment.

FIG. 7 illustrates a method 100 of manufacturing an environmentally sealed electrical housing assembly with an integrated connector 10.

In step 110, PROVIDE A GENERALLY PLANAR CIRCUIT BOARD, a generally planar circuit board 12, such as the PCB described supra is provided.

In step 112, MECHANICALLY AND ELECTRICALLY ATTACH A NON-ACCESSIBLE ELECTRICAL COMPONENT TO THE CIRCUIT BOARD, at least one electrical component 14 that will not be accessible once the manufacturing process is complete is electrically and mechanically attached to conductive traces on the circuit board 12 by a process such as soldering. In some embodiments of this method 100, a plurality of non-accessible electrical components 14, including components such as electromechanical relays, resistors and diodes, may be attached to the circuit board 12.

In step 114, MECHANICALLY AND ELECTRICALLY ATTACH A TERMINAL TO THE CIRCUIT BOARD, at least one electrical terminal 16, 18 is attached to the circuit board 12. The terminal 16, 18 is placed on the circuit board 12 in a location separate from the non-accessible electrical components 14. The terminal 16, 18 is aligned so that it is generally normal to the major surfaces of the circuit board 12. In some embodiments of this method 100, a plurality of terminals 16, 18 may be attached to the circuit board 12.

In step 116, INTEGRALLY MOLD A DIELECTRIC MATERIAL OVER THE CIRCUIT BOARD AND THE NON-ACCESSIBLE ELECTRICAL COMPONENT, the circuit board 12 along with the non-accessible electrical component 14 and the terminal 16, 18 attached to the circuit board 12 are placed in a mold and a dielectric material, such as polypropylene or NYLON is introduced into the mold so as to form a base and an integral perimeter wall 24 surrounding the terminal 16, 18. The cavity 36 defined thereby forms an open sided container that seals the non-accessible electrical component 14 from the environment while leaving the terminal 16, 18 accessible. The dielectric material may be introduced into the mold using an injection molding method or another molding method well known to those skilled in the art.

In step 118, ELECTRICALLY CONNECT A REMOVABLE ELECTRICAL COMPONENT TO THE TERMINAL, a removable electrical component 20, such as a fuse assembly, is attached to at least two terminals 18 connected to the circuit board 12.

The method 100 may further include the optional step 120. In step 120, REMOVABLY ATTACH A SEALED COVER TO THE OPEN SIDED CONTAINER, a sealed cover, such as the connector body 28 having a compliant seal 32 discussed supra, is attached to the open sided container 36 defined by the perimeter wall 24 thereby completing a sealed container around the terminal 16, 18 and the removable electrical component 20.

The embodiment of the housing assembly 10 described herein includes an electromechanical relay used as an electrical switching device. Alternative embodiments of the housing assembly may employ solid state switching devices. Electrical components, such as resistors and diodes, may be located in portions of the circuit board 12 not encased by the housing 22 making them accessible, but not necessarily removable. Alternative embodiments of the housing assembly may include other types of non-accessible components, such as microcontrollers, and may include other types of removable components, such as memory devices.

Accordingly, an environmentally sealed electrical housing assembly with an integrated connector 10 and a method 100 of manufacturing an environmentally sealed electrical housing assembly with an integrated connector 10 are provided. The housing assembly 10 provides a highly scalable power switching function that can be distributed in and among the various electrical load locations in the vehicle. The housing assembly 10 does not require any additional protection from the environment.

The housing assembly 10 allows the distribution of electrical power switching control near the electrical load and/or through the vehicle without the need of any additional environmental protection.

The application of the circuit board 12 within the housing assembly 10 allows for easy implementation of various circuit and relay configurations and power circuit protection ratings with very similar and/or the same component and assembly tools.

The application of over-molding eliminates the need for gaskets and potting or coating materials commonly used to protect printed circuit board 12 assemblies for use in the vehicle environment. The molding operation for forming the housing 22 may be included as part of the final assembly process, thus eliminating off-line molding, handling, storage, and control of additional plastic parts for the housing. The design of the molding tools is far simpler with only the exterior surface of the housing assembly 10 being of concern and critical in nature.

The housing assembly 10 provides terminals 18 to mount fuse assemblies 20, allowing for protection of the relay output circuits through the circuit board traces and into the wiring harness. The fuse assemblies 20 are environmentally protected by their location within the sealed connection formed between the housing 22 and the mating connector body 28 of the wiring harness. This allows the housing assembly 10 to be serviced by replacing the fuses individually after inspecting the integrity of the electromechanical relays.

While this invention has been described in terms of the preferred embodiments thereof, it is not intended to be so limited, but rather only to the extent set forth in the claims that follow. Moreover, the use of the terms first, second, etc. does not denote any order of importance, but rather the terms first, second, etc. are used to distinguish one element from another. Furthermore, the use of the terms a, an, etc. do not denote a limitation of quantity, but rather denote the presence of at least one of the referenced items.

We claim:

1. An environmentally sealed electrical housing assembly, comprising:
    a generally planar circuit board;

a relay mechanically and electrically connected to said circuit board, a first and second plurality of male terminals mechanically and electrically connected to said circuit board generally normal thereto at an interior location separate from said relay;

a housing formed of a dielectric material and encasing the relay and a portion of the circuit board containing the relay, wherein the housing is in intimate contact with the relay and the portion of the circuit board containing the relay, wherein the housing defines an integral perimeter wall surrounding said first and second plurality of male terminals, wherein said perimeter wall defines an opening that allows electrical and physical access to the first and second plurality of male terminals and the fusible link;

a fusible link removably attached to the second plurality of male terminals;

a connector body received in the opening, said connector body including a plurality of mating female terminals removably connected to the first plurality of male terminals, wherein the connector body, the circuit board, and the perimeter wall of the housing define an enclosed cavity containing the first and second plurality of male terminals and the fusible link; and a complaint seal disposed intermediate the integral perimeter wall and the connector body, thereby forming a sealed container around said first and second plurality of male terminals and said fusible link.

\* \* \* \* \*